US005945249A

United States Patent [19]

Patel et al.

[11] Patent Number: 5,945,249

[45] Date of Patent: Aug. 31, 1999

[54] LASER ABSORBABLE PHOTOBLEACHABLE COMPOSITIONS

[75] Inventors: Ranjan C. Patel, Little Hallingbury; Andrew W. Mott, Essex; Robert J. D. Nairne, Bishops Stortford; Mark R. I. Chambers, London; Dian E. Stevenson, Saffron Walden, all of United Kingdom

[73] Assignee: Imation Corp., Oakdale, Minn.

[21] Appl. No.: 08/844,805

[22] Filed: Apr. 22, 1997

Related U.S. Application Data

[63] Continuation-in-part of application No. 08/619,448, Mar. 19, 1996, abandoned.

[30] Foreign Application Priority Data

Apr. 20, 1995 [GB] United Kingdom .................. 95 08027
Aug. 20, 1996 [GB] United Kingdom ................ 96 174149

[51] Int. Cl.[6] .............................. G03C 1/73; G03C 7/02; G03F 7/34

[52] U.S. Cl. .......................... 430/200; 430/201; 430/339; 430/944; 430/964

[58] Field of Search .................................... 430/200, 201, 430/339, 964, 944

[56] References Cited

U.S. PATENT DOCUMENTS

| | | | |
|---|---|---|---|
| 2,701,245 | 2/1955 | Lynn | 260/89.5 |
| 2,890,969 | 6/1959 | Schossberger et al. | 117/36 |
| 3,129,661 | 4/1964 | Newman | 101/149.2 |
| 3,787,210 | 1/1974 | Roberts | 96/27 E |
| 3,852,093 | 12/1974 | O'Leary | 117/36.8 |
| 3,964,389 | 6/1976 | Peterson | 101/467 |
| 4,190,321 | 2/1980 | Dorer et al. | 350/165 |
| 4,252,843 | 2/1981 | Dorer et al. | 427/162 |
| 4,340,276 | 7/1982 | Maffitt et al. | 350/164 |
| 4,343,891 | 8/1982 | Aasen et al. | 430/337 |
| 4,447,521 | 5/1984 | Tiers et al. | 430/337 |
| 4,501,808 | 2/1985 | Sakai et al. | 430/59 |
| 4,514,493 | 4/1985 | Hirai et al. | 430/617 |
| 4,529,684 | 7/1985 | Sasagawa et al. | 430/269 |
| 4,540,618 | 9/1985 | Suzuki et al. | 428/141 |
| 4,541,830 | 9/1985 | Hotta et al. | 8/471 |
| 4,588,674 | 5/1986 | Stewart et al. | 430/273 |
| 4,602,263 | 7/1986 | Borror et al. | 346/201 |
| 4,615,938 | 10/1986 | Hotta et al. | 428/323 |
| 4,626,493 | 12/1986 | Hutters et al. | 430/201 |
| 4,634,652 | 1/1987 | Barton | 430/156 |

(List continued on next page.)

FOREIGN PATENT DOCUMENTS

| | | | |
|---|---|---|---|
| 0 040 978 | 5/1981 | European Pat. Off. | G03C 5/38 |
| 0 109 772 | 10/1983 | European Pat. Off. | G03C 7/02 |
| 0 109 295 | 11/1983 | European Pat. Off. | B41M 5/26 |
| 0 120 601 | 10/1984 | European Pat. Off. | G03C 7/02 |
| 0 163 297 | 5/1985 | European Pat. Off. | B41M 5/26 |
| 0 174 054 | 3/1986 | European Pat. Off. | B41M 5/26 |
| 0 302 610 | 2/1989 | European Pat. Off. | G03C 7/02 |
| 0 382 420 | 2/1990 | European Pat. Off. | B29C 35/08 |
| 0 403 157 | 6/1990 | European Pat. Off. | G03C 1/498 |
| 0 454 083 | 4/1991 | European Pat. Off. | B41M 5/34 |
| 0 462 763 | 12/1991 | European Pat. Off. | G03C 7/02 |
| 0 530 018 | 8/1992 | European Pat. Off. | B41M 5/40 |
| 0 515 133 | 11/1992 | European Pat. Off. | C07D 311/82 |
| 0 544 284 | 11/1992 | European Pat. Off. | B41M 5/40 |
| 0 566 103 | 4/1993 | European Pat. Off. | B41M 5/40 |
| 0 593 364 | 10/1993 | European Pat. Off. | B41J 2/48 |
| 0 602 893 | 12/1993 | European Pat. Off. | B41M 5/38 |
| 0 675 003 | 3/1995 | European Pat. Off. | B41M 5/38 |
| 0 679 532 | 4/1995 | European Pat. Off. | B41M 5/38 |
| 0 681 210 | 11/1995 | European Pat. Off. | G03C 1/498 |

(List continued on next page.)

OTHER PUBLICATIONS

S. Chatterjee et al., "Photochemistry of Carbocyanine Alkyltriphenylborate Salts: Intra–Ion–Pair Electron Transfer and the Chemistry of Boranyl Radicals", *J. Am. Chem. Soc.*, 112, pp. 6329–6338 (1990).

D. Hare et al., "Highly time– and space–resolved studies of superfast image production using laser ablation transfer", *Microchemistry,* 123–135 (1994).

H. Kim et al., "Molecular dynamics simulation of nanoscale thermal conduction and vibrational cooling in a crystalline naphthalene cluster", *J. Chem. Phys.,* 94 8203–8209 (1991).

I. Lee et al., "Direct measurement of polymer temperature during laser ablation using amolecular thermometer", *J. Appl., Phys.,* 72, 2440–2448 (1992).

I. Lee et al., "Dynamics of Laser Ablation Transfer Imaging Investigated by Ultrafast Microscopy", *J. Imag. Sci. Tech.,* 36, 180–187 (1992).

G. Pinto, "Dynamics of Laser Ablation Transfer Thermal Imaging: Fundamental Mechanisms Investigated by SIMS Surface Analysis", *J. Imag. Sci. Tech.,* 38, 565–570 (1994).

R. Srinivasan et al., "Ultraviolet Laser Ablation of Organic Polymers", *Chem. Rev.,* 89, 1303–1316 (1989).

W. Tolbert et al., "High–Speed Color Imaging by Laser Ablation Transfer with a Dynamic Release Layer: Fundamental Mechanisms",*J. Imag. Sci. Tech.,* 37, 411–421 (1993).

W. Tolbert et al., "Laser Ablation Transfer Imaging Using Picosecond Optical Pulses: Ultra–High Speed, Lower Threshold and High Resolution", *J. Imag. Sci. Tech.,* 37 485–489 (1993).

W. Tolbert et al., "Ultrafast Dynamics of Photothermal Polymer Ablation",*American Institute of Physics, AIP Conf. Proceedings 288,* 559–568 (Apr. 1993).

(List continued on next page.)

*Primary Examiner*—Richard L. Schilling
*Attorney, Agent, or Firm*—William D. Bauer

[57] ABSTRACT

A laser addressable thermal imaging element comprising a bleachable photothermal converting dye in association with a heat-sensitive imaging medium, and a photoreducing agent for said dye, said photoreducing agent bleaching said dye on laser address of the element. The imaging element may be in the form of a colorant transfer system, a peel-apart system, a phototackification system or a unimolecular thermal fragmentation system. Also provided is a method of crosslinking a resin by leaser irradiation, which is useful in the production of colored images.

12 Claims, No Drawings

U.S. PATENT DOCUMENTS

| | | | |
|---|---|---|---|
| 4,663,269 | 5/1987 | Narang et al. | 430/326 |
| 4,701,402 | 10/1987 | Patel et al. | 430/332 |
| 4,711,834 | 12/1987 | Butters et al. | 430/201 |
| 4,720,450 | 1/1988 | Ellis | 430/339 |
| 4,769,459 | 9/1988 | Patel et al. | 544/301 |
| 4,772,582 | 9/1988 | DeBoer | 503/227 |
| 4,777,159 | 10/1988 | Taguchi et al. | 503/227 |
| 4,788,128 | 11/1988 | Barlow | 430/200 |
| 4,816,378 | 3/1989 | Powers et al. | 430/301 |
| 4,816,379 | 3/1989 | Bronstert et al. | 430/306 |
| 4,819,010 | 4/1989 | Kohashi et al. | 346/76 PH |
| 4,826,717 | 5/1989 | Kohnshi et al. | 428/143 |
| 4,826,976 | 5/1989 | Borror et al. | 544/58.4 |
| 4,857,431 | 8/1989 | Kato et al. | 430/91 |
| 4,876,235 | 10/1989 | DeBoer | 503/227 |
| 4,885,225 | 12/1989 | Heller et al. | 430/160 |
| 4,897,310 | 1/1990 | Beyer et al. | 428/412 |
| 4,950,639 | 8/1990 | DeBoer et al. | 503/227 |
| 4,973,572 | 11/1990 | DeBoer | 503/227 |
| 5,017,547 | 5/1991 | DeBoer | 503/227 |
| 5,019,549 | 5/1991 | Kellogg et al. | 503/227 |
| 5,034,371 | 7/1991 | Tanaka et al. | 503/227 |
| 5,053,381 | 10/1991 | Chapman et al. | 503/227 |
| 5,064,743 | 11/1991 | Koshizuka et al. | 430/253 |
| 5,089,372 | 2/1992 | Kirihata et al. | 430/167 |
| 5,126,760 | 6/1992 | DeBoer | 346/108 |
| 5,135,842 | 8/1992 | Kitchin et al. | 430/510 |
| 5,153,104 | 10/1992 | Rossman et al. | 430/339 |
| 5,153,105 | 10/1992 | Sher et al. | 430/339 |
| 5,156,938 | 10/1992 | Foley et al. | 430/200 |
| 5,166,041 | 11/1992 | Murofushi et al. | 430/339 |
| 5,171,650 | 12/1992 | Ellis et al. | 430/20 |
| 5,219,703 | 6/1993 | Bugner et al. | 430/200 |
| 5,232,817 | 8/1993 | Kawakami et al. | 430/201 |
| 5,238,736 | 8/1993 | Taeng et al. | 428/327 |
| 5,238,778 | 8/1993 | Hirai et al. | 430/200 |
| 5,246,909 | 9/1993 | Thien et al. | 503/227 |
| 5,254,524 | 10/1993 | Guittard et al. | 503/227 |
| 5,256,506 | 10/1993 | Ellis et al. | 430/20 |
| 5,266,452 | 11/1993 | Kitchin et al. | 430/510 |
| 5,278,576 | 1/1994 | Kaszczuk et al. | 346/1.1 |
| 5,306,686 | 4/1994 | Patel et al. | 503/200 |
| 5,310,595 | 5/1994 | Ali et al. | 428/206 |
| 5,314,795 | 5/1994 | Helland et al. | 430/517 |
| 5,329,300 | 7/1994 | Nishiyama | 346/108 |
| 5,352,562 | 10/1994 | Takahashi et al. | 430/253 |
| 5,380,644 | 1/1995 | Yonkoski et al. | 430/617 |
| 5,395,729 | 3/1995 | Reardon et al. | 430/200 |
| 5,395,747 | 3/1995 | Helland et al. | 430/510 |
| 5,399,459 | 3/1995 | Simpson et al. | 430/270 |
| 5,401,606 | 3/1995 | Reardon et al. | 430/200 |
| 5,441,794 | 8/1995 | Hitomi et al. | 428/195 |
| 5,468,603 | 11/1995 | Kub | 430/619 |
| 5,475,418 | 12/1995 | Patel et al. | 347/256 |
| 5,501,937 | 3/1996 | Matsumoto et al. | 430/200 |
| 5,516,622 | 5/1996 | Savini et al. | 430/200 |
| 5,518,861 | 5/1996 | Coveleskie et al. | 430/200 |
| 5,521,035 | 5/1996 | Wolk et al. | 430/20 |
| 5,563,019 | 10/1996 | Blanchet-Fincher | 430/200 |
| 5,580,693 | 12/1996 | Nakajima et al. | 430/200 |
| 5,593,808 | 1/1997 | Ellis | 430/261 |
| 5,622,795 | 4/1997 | Ellis | 430/201 |
| 5,633,133 | 5/1997 | Ellis | 430/201 |
| 5,663,033 | 9/1997 | Warner et al. | 430/257 |
| 5,705,314 | 1/1998 | Kapusniak et al. | 430/254 |
| 5,757,313 | 5/1998 | Meneghini et al. | 347/262 |
| 5,773,188 | 6/1998 | Ellis | 430/201 |

FOREIGN PATENT DOCUMENTS

| | | | |
|---|---|---|---|
| 0 738 609 | 4/1996 | European Pat. Off. | B41M 5/28 |
| 0 738 930 | 4/1996 | European Pat. Off. | G03F 7/095 |
| 0 739 748 | 4/1996 | European Pat. Off. | B41M 5/30 |
| 0 722 828 | 7/1996 | European Pat. Off. | B41C 1/10 |
| 0 751 008 | 7/1996 | European Pat. Off. | B41M 5/40 |
| 46-3710 | 1/1971 | Japan . | |
| 51-88016 | 1/1975 | Japan | G03C 1/72 |
| 56-46789 | 4/1981 | Japan | B41M 5/26 |
| 63-319191 | 12/1981 | Japan | B41M 5/26 |
| 63-319192 | 12/1981 | Japan | B41M 5/26 |
| 57-014095 | 1/1982 | Japan | B41M 5/18 |
| 59-101398 | 6/1984 | Japan | B41M 5/26 |
| 59-133098 | 7/1984 | Japan | B41B 5/26 |
| 60-234888 | 11/1985 | Japan | B41M 5/26 |
| 61-137790 | 6/1986 | Japan | B41M 5/26 |
| 61-206691 | 12/1986 | Japan | B41M 5/26 |
| 61-291184 | 12/1986 | Japan | B41M 5/26 |
| 62-140884 | 6/1987 | Japan | B41M 5/26 |
| 63-022684 | 1/1988 | Japan | B41M 5/26 |
| 63-161445 | 7/1988 | Japan | G03C 1/00 |
| 63-185680 | 8/1988 | Japan | B41M 5/26 |
| 64-1589 | 1/1989 | Japan | B41M 5/26 |
| 4-327982 | 3/1991 | Japan | B41M 3/12 |
| 4-189189 | 7/1991 | Japan | B41M 5/30 |
| 5-139036 | 6/1993 | Japan | B41M 5/26 |
| 8-267943 | 10/1996 | Japan | B41M 5/40 |
| 8-267944 | 10/1996 | Japan | B41M 5/40 |
| 8-290675 | 11/1996 | Japan | B41M 5/26 |
| 1 370 058 | 12/1972 | United Kingdom | G03C 1/72 |
| 1 386 269 | 12/1972 | United Kingdom | B03C 1/72 |
| 1 399 958 | 7/1975 | United Kingdom | B41M 5/26 |
| 2 083 726 | 3/1982 | United Kingdom | H04N 1/22 |
| 2 176 018 | 12/1986 | United Kingdom | B41M 5/26 |
| WO 88/04237 | 6/1988 | WIPO | B41M 5/26 |
| WO 90/12342 | 10/1990 | WIPO | G03C 1/492 |
| WO 93/03928 | 3/1993 | WIPO | B41M 5/40 |
| WO 93/04411 | 3/1993 | WIPO | G03G 17/10 |
| WO 94/04368 | 3/1994 | WIPO | B41M 5/26 |
| WO 95/05623 | 2/1995 | WIPO | G03C 3/00 |
| WO 95/13195 | 5/1995 | WIPO | B41M 5/38 |
| WO 96/34767 | 11/1996 | WIPO | B41M 5/38 |

OTHER PUBLICATIONS

X. Wen et al., "Multiphonon up–pumping and molecular hot spots in superheated polymers studied by ultrafast optical calorimetry", *Chem. Phys. Ltrs.,* 192, 315–320 (1992).

J. Yeh, "Laser ablation of polymers", *J. Vac. Sci. Tech.,* 4, 653–658 (1986).

S. Chen et al ., "Applications of Ultrafast Temperature Jump Spectroscopy to Condensed Phase Molecular Dynamics", *J. Phys. Chem.,* 96, 7178–7186 (1992).

T.J. Chuang, "Laser–Photoetching Characteristics of Polymers with Dopants", *Applied Physics A,* 45, 277–288 (1988).

D. Dlott, "Ultrafast microscopy and ultrafast calorimetry studies of laser polymer ablation", *20th Int'l Congress—SPIE,* 1801, 870–879 (1992).

D. Hare et al., "Fundamental Mechanisms of Laser Ablation Transfer Imaging", *IS&T's Tenth Int'l Congress on Advances in Non–impact Printing Technologies*, 314–316 (1994).

S. Chatterjee et al., "Electron–Transfer Reactions in Cyanine Borate Ion Pairs: Photopolymerization Initiators Sensitive to Visible Light", *J. Am. Chem. Soc.,* 110, 2326–2328 (1988).

M.L. Levene et al., "Material Transfer Recording", *Applied Optics,* 9(10) 2260–2265 (1970).

M. Matsuoka et al., "Photoreduction of Cyanine Borate Infrared Absorbing Dyes", *J. Chem. Soc. Chem. Commun.,* 299–301 (1993).

C. Pac et al., "$Ru(bpy)_3^{2+}$–Mediated Photoreduction of Olefins with 1–Benzyl–1,4–dihydronicotinamide: A Mechanistic NAD(P)H–Model Compounds[1]", *Amer. Chem. Soc.,* 103, 6495–6497 (1981).

D. Teegarden et al., "Contrast Enhancement Lithography System Based on Pyrylium Dye Bleach Chemistry", *J. Imag. Sci. Tech.,* 37, 149–155 (1993).

X. Zhang et al., "Laser–Initiated Synthesis: 2,4,5,7–Tetraiodo–6–hydroxy–3–fluorone as a Visible Photoinitiator", *J. Org. Chem.,* 58, 2614–2618 (1993).

LASER ABSORBABLE PHOTOBLEACHABLE COMPOSITIONS

CROSS-RERFERENCE TO RELATED APPLICATIONS

This application is a Continuation-In-Part of U.S. application Ser. No.08/619,448, filed on Mar. 19, 1996,now abandoned, the disclosure of which is incorporated by reference.

FIELD OF THE INVENTION

The invention relates to heat-sensitive imaging media which are imageable by laser address. The present invention also provide alternative methods and materials for the crosslinking of resins by laser irradiation followed by heat treatment, which find use in the production of colored images by dry transfer.

BACKGROUND TO THE INVENTION

There is a continuing interest in the generation of hard copy from images created and/or stored in digitized form. Various devices have been designed for the output of such images in hard copy, such as ink-jet printers, thermal printers and laser scanners of various types. Laser scanners are particularly attractive output devices in view of their high resolution capability and the variety of different imaging media (e.g., both light-sensitive and heat-sensitive materials) that may be adapted for laser address.

Many heat-sensitive imaging media which are imageable by laser address comprise a photothermal converter, which converts laser radiation to heat, the heat being used to trigger the imaging process. IR-emitting lasers such as YAG lasers and laser diodes, are most commonly used for reasons of cost, convenience and reliability. Therefore, IR-absorbing dyes and pigments are most commonly used as the photothermal converter, although address at shorter wavelengths, in the visible region, is also possible as described in Japanese Patent Publication No. 51-88016.

Of particular interest are laser addressable thermal media giving rise to color images. Typically, such materials employ a donor sheet comprising a layer of colorant, which is placed in contact with a receptor, an IR absorber being present in one or both of the donor and receptor. Most commonly, the IR absorber is present only in the donor. When the assembly is exposed to a pattern of IR radiation, normally from a scanning laser source, the radiation is absorbed by the IR absorber, causing a rapid build-up of heat in the exposed areas, which in turn causes transfer of colorant from the donor to the receptor in those areas. By repeating the process with one or more different colored donors, a multi-color image can be assembled on a common receptor. The system is particularly suited to the color proofing industry, where color separation information is routinely generated and stored electronically and the ability to convert such data into hardcopy via digital address of "dry" media is seen as a great advantage.

The best-known of these systems are the various forms of thermal transfer imaging, including dye diffusion (or sublimation) transfer of a colorant without a binder (as described in U.S. Pat. No. 5,126,760), mass transfer of dyed or pigmented layers in a molten state (i.e., "melt-stick transfer" as described in JP 63-319192), and ablation transfer of dyes and pigments as a result of decomposition of binders or other ingredients to gaseous products causing physical propulsion of colorant material to the receptor (as described in U.S. Pat. No. 5,171,650 and WO90/12342). Other types of laser thermal color imaging media include those based on the formation or destruction of colored dyes in response to heat (U.S. Pat. No. 4,602,263), those based on the migration of toner particles into a thermally softened layer (WO93/0441 1) and various peel-apart systems wherein the relative adhesion of a colored layer to a substrate and a coversheet is altered by heat (WO93/03928, WO88/04237, and DE4209873).

A problem common to all of these media is the possibility of contamination of the final image by the laser absorber. For example, in the case of thermal transfer media, the absorber may be cotransferred with the colorant. Unless the cotransferred absorber has absolutely no absorption bands in the visible part of the spectrum, the color of the image will be altered. Various attempts have been made to identify IR dyes with minimal visible absorption (e.g., EP-A-0157568), but in practice the IR absorption band nearly always tails into the visible region, leading to contamination of the image.

A number of methods have been proposed to remove contamination by the absorber of the final image. For example EP-A-0675003 describes contacting the transferred image of laser thermal transfer imaging with a thermal bleaching agent capable of bleaching the absorber. This method complicates the imaging process and it has not been possible to bleach certain dyes, for example, CYASORB 165 (American Cyanamid) which is commonly used with YAG-lasers. WO93/04411 and U.S. Pat. No. 5,219,703 disclose an acid-generating compound which bleaches the IR absorbing dye. However, an additional UV exposure is generally required (optionally in the presence of a UV absorber), again complicating the imaging process. Thus, there is a continuing need for improved methods of bleaching the IR absorbing dye in laser addressed thermal media.

Photoredox processes involving dyes have been disclosed in the art. A photoexcited dye may accept an electron from a coreactant, the dye acting as a photo-oxidant. There are a number of examples where this type of process has been used, although not in the context of laser-addressable thermal imaging media. In particular, there are a number of systems comprising a cationic dye in reactive association with an organoborate ion (see U.S. Pat. No. 5,329,300, U.S. Pat. No. 5,166,041, U.S. Pat. No. 4,447,521, U.S. Pat. No. 4,343,891, and J. Chem. Soc. Chem. Commun., 299 (1993)). After transferring an electron to the excited dye, organoborate ions fragment into free radicals which may initiate polymerization reactions (*J. Am. Chem. Soc.,* 110, 2326–2328 (1985)) or may react further and thus form an image (U.S. Pat. No. 4,447,521 and U.S. Pat. No. 4,343, 891).

Another example of imaging involving photoreduction of a dye is disclosed in U.S. Pat. No. 4,816,379. This describes media comprising a photocurable layer containing a UV photoinitiator and photopolymerizable compounds, the layer additionally comprising a cationic dye of defined structure and a mild reducing agent capable of reducing said dye in its photoexcited state. Imagewise exposure at a wavelength absorbed by the cationic dye causes photoreduction of same and generation of a polymerization inhibitor, so that a subsequent uniform UV exposure gives polymerization only in the previously unexposed areas. Conventional wet development leaves a positive image. The cationic dyes are described as visible-absorbing, and are of a type not known to be IR-absorbing. Shifts in the absorbance of the cationic dyes (including bleaching) are noted. The preferred reducing agents are salts of N-nitrosocyclohexylhydroxylamine, but other possibilities include ascorbic acid and thiourea derivatives. There is no disclosure of thermal imaging media, however.

*J. Imaging Sci. & Technol.,* 37, 149–155 (1993) describes the photoreductive bleaching of pyrylium dyes by allylthiourea derivatives under conditions of UV flood exposure. EP-A-0515133 and *J. Org. Chem.,* 58, 2614–2618 (1993) disclose the photoreduction of neutral xanthene dyes by amines and other electron donors, for initiation of polymerization and in photosynthetic applications. The ability of dihydropyridine derivatives to transfer an electron to a photoexcited Ru(III) complex is disclosed in *J. Amer. Chem. Soc.,* 103, 6495–6497 (1981). The reactions were carried out in solution and were not used for imaging purposes, however.

Thus, laser addressable thermal imaging media are still needed in which residual visible coloration from the laser absorber is minimized, and (in certain cases) in which crosslinking of the media is induced.

SUMMARY OF THE INVENTION

The present invention provides improved laser addressable thermal imaging media in which residual visible coloration from the laser absorber is minimized, and (in certain cases) in which crosslinking of the media is induced.

In a first aspect of the invention there is provided a laser addressable thermal imaging medium comprising a photothermal converting dye in association with a heat-sensitive imaging system and a photoreducing agent for said dye, said photoreducing agent bleaching said dye during laser address of the element.

A preferred class of photoreducing agent (i.e., reducing agent) comprises the 1,4-dihydropyridine derivatives having the formula:

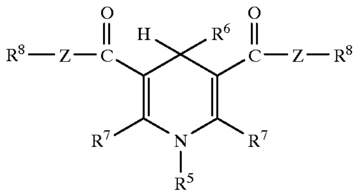

wherein: $R^5$ is selected from the group of H, alkyl, aryl, alicyclic, and heterocyclic groups; $R^6$ is an aryl group; each $R^7$ and $R^8$ is independently selected from the group of alkyl, aryl, alicyclic and heterocyclic groups; and Z represents a covalent bond (i.e., $R^8$ is directly bonded to the carbonyl group) or an oxygen atom.

1,4-Dihydropyridines of this formula are found to bleach certain cationic dyes rapidly and cleanly when the latter are photoexcited, but are stable towards the dyes at room temperature in the dark. Furthermore, they are readily synthesized, stable compounds and do not give rise to colored degradation products, and so are well suited for use in media that generate colored images.

Therefore, in a further aspect of the present invertion, there is provided a method of bleaching a cationic dye by photoirradiating a cationic dye to an electronically excited state in the presence of a 1,4-dihydropyridine of the above formula.

"Laser-addressable thermal imaging media" refers to imaging media in which an image forms in response to heat, said heat being generated by absorption of coherent radiation (as is emitted by lasers, including laser diodes). Preferably, the image formed is a color image, and in preferred embodiments the thermal imaging medium is a colorant donor medium.

To be able to function in this way, the media must comprise a "photothermal converter," i.e., a substance which absorbs incident radiation with concomitant generation of heat. When a dye absorbs radiation, a proportion of its molecules are converted to an electronically excited state, and the basis of photothermal conversion is the dissipation of this electronic excitation as vibrational energy in the surrounding molecules, with the dye molecules reverting to the ground state. The mechanism of this dissipation is not well understood, but it is generally believed that the lifetime of the excited state of the dye is very short (e.g., on the order of picoseconds, as described by Schuster et al., *J. Am. Chem. Soc.,* 112, 6329 (1990)). Thus, in the absence, of competing processes, a dye molecule might experience many excitation-deexcitation cycles during even the shortest laser pulses normally encountered in laser thermal imaging (on the order of nanoseconds).

Possible competing processes include photoredox processes in which the photo-excited dye molecules donate or accept an electron to or from a reagent in its ground state. This may initiate further chemical transformations which destroy the dye's ability to undergo further excitation-deexcitation cycles. Of particular relevance to the present invention are photoreduction processes, in which it is believed a suitable reducing agent donates an electron to fill the vacancy caused in the dye's lower energy orbitals when an electron is promoted to a higher energy orbital by photoexcitation. The process is believed to occur most readily in the case of cationic dyes (which have a positive charge associated with the chromophore), but also has been observed in the case of neutral dyes such as xanthenes (see U.S. Pat. No. 4,816,379, EP-A-0515133) but not in the context of thermal imaging media. In the present context, the process provides a convenient and effective method of bleaching a laser-absorbing dye without, surprisingly, significantly affecting the dye's ability to act as a photothermal converter.

In the prior art, the problem of bleaching a laser-absorbing dye has been tackled by causing the dye to react with a bleaching agent subsequent to its fulfilment of the photothermal conversion role, but in the present invention bleaching occurs when the dye is in its excited state, i.e., when it is in the process of fulfilling its photothermal conversion role. This might have been expected to seriously impair the photothermal conversion effect, but in practice there is little or no reduction in sensitivity. What is apparently obtained is a more controlled generation of heat, with less tendency for "runaway" temperature rises which may lead to indiscriminate vaporization of the media. If milder imaging processes are desired, such as melt-stick transfer, where it is desirable to preserve the integrity of the media, this effect is highly beneficial.

"Bleaching" in the context of this invention means an effective diminution of absorption bands giving rise to visible coloration by the photothermal converting dye. Bleaching may be achieved by destruction of the aforementioned absorption bands, or by shifting them to wavelengths that do not give rise to visible coloration.

According to another aspect of the invention, there is provided a method of curing a resin having a plurality of hydroxyl groups, comprising the sequential steps of:

(i) placing said resin in reactive association with a latent curing agent and an infrared dye;

(ii) subjecting the resulting mixture to laser irradiation at a wavelength absorbed by said infrared dye; and (iii) heating the irradiated mixture;

wherein the latent curing agent is a compound of the formula:

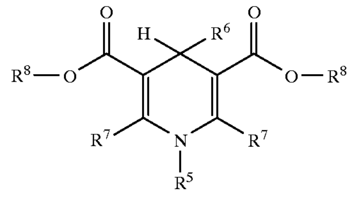

wherein: $R^5$ is selected from the group of H, an alkyl group, a cycloalkyl group, and an aryl group; $R^6$ is an aryl group; and each $R^7$ and $R^8$ is independently selected from the group of an alkyl group and an aryl group. These 1,4-dihydropyridine latent curing agents are a subset of the 1,4-dihydropyridine photoreducing agents described above. Thus, one compound can be used to perform both functions if desired.

The term "reactive association" used herein means that the resin, infrared dye, photoreducing agent, and/or latent curing agent are disposed in a manner that permits their mutual chemical and/or photochemical interaction, for example, by virtue of them being coated together in a single layer on a substrate or in contiguous layers.

The curing method of the invention is particularly useful in the field of laser thermal transfer imaging. Therefore, according to another aspect of the invention, there is provided an imaging method comprising the sequential steps of:

(a) assembling in mutual contact a donor sheet (i.e., donor element) and a receptor sheet (i.e., receptor element), said donor sheet comprising a support coated with a transfer medium comprising in one or mere layers a resin having a plurality of hydroxy groups, a latent curing agent and in infrared dye;

(b) exposing the assembly to a pattern of laser radiation of a wavelength absorbed by said infrared dye so as to cause transfer of portions of the transfer medium from the donor sheet to the receptor sheet in accordance with said pattern;

(c) separating the donor sheet and the receptor sheet; and (d) heating the receptor sheet so as to effect curing of the portions of the transfer medium transferred thereto;

wherein the latent curing agent is a compound having the formula defined above.

In some embodiments of the invention, the transfer medium is a colorant transfer medium and additionally comprises a pigment. Therefore, according to another aspect of the invention, there is provided a laser-imageable colorant transfer medium comprising, in one or more layers, a pigment, a resin having a plurality of hydroxy groups, an infrared dye, and a latent curing agent of the formula defined above.

When the transfer medium is a colorant transfer medium, steps (a) to (c) of the imaging method of the invention may be repeated one or more times, using the same receptor sheet in each case, but using a different donor sheet, comprising a transfer medium of a different color, in each case. This enables a multicolor image to be assembled on the receptor sheet. In such circumstances, step (d) may be carried out after each colorant transfer step, but is more conveniently carried out only once, after all the colorant transfer steps have been performed.

DETAILED DESCRIPTION OF PREFERRED EMBODIMENTS

Depending on the choice of photoreducing agent or latent curing agent, dyes suitable for use in the invention include cationic dyes such as polymethine dyes, pyrylium dyes, cyanine dyes, diamine dication dyes, phenazinium dyes, phenoxazinium dyes, phenothiazinium dyes, acridinium dyes, and also neutral dyes such as the xanthene dyes disclosed in EP-A-0515133 and squarylium dyes. Preferred dyes have absorption maxima that match the output of the laser sources most commonly used for thermal imaging such as laser diodes and YAG lasers. Absorption in the range of 600–1500 nm is preferred, and in the range of 700–1200 nm is most preferred.

For use in embodiments that include a latent curing agent, the infrared dye is preferably a cationic dye in which the infrared-absorbing chromophore bears a delocalized positive charge, which is balanced by a negatively charged counterion such as perchlorate, tetrafluoroborate, hexafluorophosphate, and the like. It is believed that dyes of this type can facilitate the oxidation of the latent curing agents when photo-excited by laser irradiation (see discussion below).

Preferred classes of cationic dyes for use in the invention include the tetraarylpolymethine (TAPM) dyes. Such dyes comprise a polymethine chain having an odd number of carbon atoms (5 or more), each terminal carbon atom of the chain being linked to two aryl substituents. These generally absorb in the 700–900 nm region, making them suitable for diode laser address, and there are several references in the literature to their use as absorbers in laser address thermal transfer media, e.g., JP-63-319191, JP-63-319192 and U.S. Pat. No. 4,950,639. When these dyes are cotransferred with the colorant, a blue cast is given to the transferred image because the TAPM dyes generally have absorption peaks which tail into the red region of the spectrum. European Patent Application No. EP-A-675003 describes the thermal bleaching of TAPM dyes in the thermal transfer media via the provision of thermal bleaching agents in the receptor layer. It has now been found that TAPM dyes can be bleached cleanly by a photoreductive process as described in the present invention, wherein the bleaching agent is in the donor element.

The general formula for TAPM dyes is disclosed in U.S. Pat. No. 5,135,842. Preferred examples have the following formula (I):

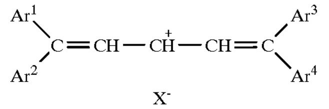

wherein: $Ar^1$ to $Ar^4$ are aryl groups that are the same or different and at least one (preferably at least two) of $Ar^1$ to $Ar^4$ have a tertiary amino group (preferably in the 4-position), and X is an anion. Preferably no more than two of said aryl groups bear a tertiary amino group. The aryl groups bearing said tertiary amino groups are preferably attached to different ends of the polymethine chain (i.e., $Ar^1$ or $Ar^2$ and $Ar^3$ or $Ar^4$ bear tertiary amino groups).

Examples of tertiary amino groups include dialkylimino groups (such as dimethylamino, diethylamino, etc.), diarylamino groups (such as diphenyl amino), alkylarylamino groups (such as N-methylanilitio), and heterocyclic groups such as pyrrolidino, morpholino, and piperidiino. The tertiary amino group may form part of a fused ring system, e.g., one or more of $Ar^1$ to $Ar^4$ may represent a julolidine group.

For certain embodiments, the aryl groups represented by $Ar^1$ to $Ar^4$ may comprise phenyl, naphthyl, or other fused ring systems, but phenyl rings are preferred. In addition to the tertiary amino groups discussed previously, substituents which may be present on the rings include alkyl groups (preferably of up to 10 carbon atoms), halogen atoms (such as Cl, Br, etc.), hydroxy groups, thioether groups and alkoxy groups. Substituents which donate electron density to the conjugated system, such as alkoxy groups, are particularly preferred. Substituents, especially alkyl groups of up to 10 carbon atoms or aryl groups of up to 10 ring atoms, may also be present on the polymethine chain.

Preferably the anion X is derived from a strong acid (e.g., HX should have a pKa of less than 3, preferably less than 1). Suitable identities for X include $ClO_4$, $BF_4$, $CF_3SO_3$, $PF_6$, $AsF_6$, $SbF_6$, and perfluoroethylcyclohexylsuphonate.

Preferred dyes of this class include:

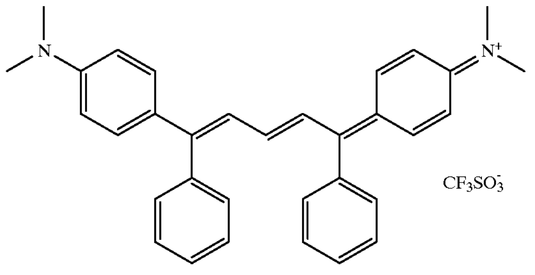

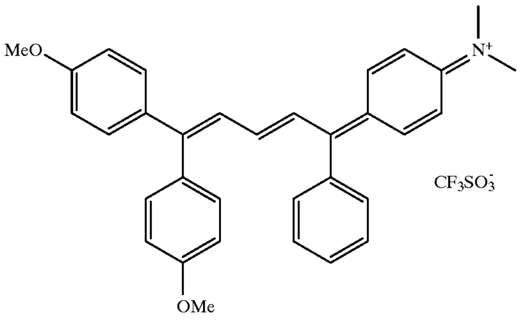

The relevant dyes may be synthesized by known methods, e.g., by conversion of the appropriate benzophenones to the corresponding 1,1-diarylethylenes (by the Wittig reaction, for example), followed by reaction with a trialkyl orthoester in the presence of strong acid HX.

Another preferred class of cationic dye is amine cation radical dyes, also known as immonium dyes, described, for example, in WO90/12342 and JP-51-88016 and (in greater detail) in European Patent Application No. 96302794.1. These include diamine di-cation dyes, exemplified by the commercially available CYASORB IR165 (American Cyanamid), which have the formula (II):

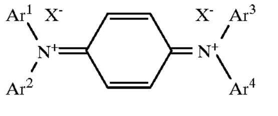

in which $Ar^1$ to $Ar^4$ and X are as defined above. Although these dyes show peak absorptions at relatively long wavelengths (approximately 1050 nm, suitable for YAG laser address), the absorption band is broad and tails into the red region. EP-A-0675003 teaches that partial bleaching of diamine di-cation dyes is possible through a thermal process, but it has now been found that total bleaching may be achieved by a photoreductive process.

The reducing agent used in the invention may be any compound or group capable of interacting with the photothermal converting dye and bleaching the same under the conditions of photoexcitation and high temperature associated with laser address of thermal imaging media, but must not react with the dye in its ground state under normal storage conditions. The reducing agent acts as a photoreductant towards the dye, i.e., it transfers an electron only to the photoexcited form of the dye, so that the composition is stable in the absence of photoexcitation. The choice of reducing agent may depend on the choice of laser-absorbing dye. Candidate combinations of dye and reducing agent may be screened for suitability by coating mixtures of dye and reducing agent (optionally in a mutually compatible binder) on a transparent substrate, and thereafter monitoring the effect on the absorption spectrum of the dye of (a) storage of the coating in the dark at moderately elevated temperatures for several days, and (b) irradiation of the coating at the absorption maximum of the dye by a laser source. For a suitable combination, conditions (a) should have minimal effect and conditions (b) should bleach the dye.

Reducing agents suitable for use in the invention are generally good electron donors, i.e., have a low oxidation potential (Eox), typically less than 1.0V, and preferably not less than 0.40V. Depending on the choice of photothermal converting dye, they may be neutral molecules or anionic groups. Examples of anionic groups include the salts of N-nitrosocyclohexylhydroxylamine disclosed in U.S. Pat. No. 4,816,379, N-phenylglycine salts and organoborate salts comprising an anion of formula (III):

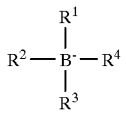

wherein: each $R^1$ to $R^4$ is independently selected from the group, of alkyl, aryl, alkenyl, alkynyl, silyl, alicyclic, and saturated, and unsaturated heterocyclic groups, including substituted derivatives of these groups, with the proviso that at least one of $R^1$ to $R^4$ is an alkyl group of up to 8 carbon atoms. $R^1$ to $R^4$ can include aralkyl and alkaryl groups, for example.

U.S. Pat. No. 5,166,041 describes the photobleaching of a variety of IR-absorbing cationic dyes by such species, but not in the context of laser addressed thermal imaging. Likewise, photobleaching of visible-absorbing cyanine dyes by alkylborate ion is described in U.S. Pat. No. 4,447,521 and U.S. Pat. No. 4,343,891. Anionic reducing agents may be formulated as the counterion to the cationic dye.

Neutral reducing agents suitable for use in the invention generally (but not necessarily) possess one or more labile hydrogen atoms or acyl groups which may be transferred to the dye subsequent to electron transfer, hence effecting irreversible bleaching of the dye. Examples of neutral reducing agents include the thiourea derivatives mentioned in U.S. Pat. No. 4,816,379, ascorbic acid, benzhydrols, phenols, amines and leuco dyes (including acylated derivatives thereof). It is highly desirable that the photo-oxidation products of the reducing agent should not themselves be visibly colored. Surprisingly, in certain cases it has been found possible to employ leuco dyes as reducing agents without generating unwanted coloration.

A preferred class of reducing agent comprises the 1,4-dihydropyridine derivatives having the formula (IV):

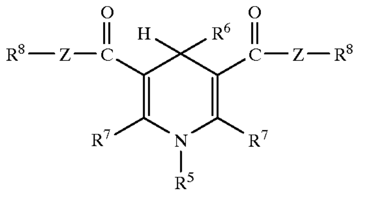

wherein: $R^5$ is selected from the group of H, alkyl, aryl, alicyclic, and heterocyclic groups; $R^6$ is an aryl group; each $R^7$ and $R^8$ is independently selected from the group of alkyl, aryl, alicyclic, and heterocyclic groups; and Z represents a covalent bond (i.e., $R^8$ is directly bonded to the carbonyl group) or an oxygen atom.

"Alkyl" refers to alkyl groups of up to 20 preferably up to 10, and most preferably lower alkyl, meaning up to 5 carbon atoms. "Aryl" refers to aromatic rings or fused ring systems of up to 14, preferably up to 10, most preferably up to 6 carbon atoms. "Alicyclic" refers to non-aromatic rings or fused ring systems of up to 14, preferably up to 10, most preferably up to 6 carbon atoms. "Heterocyclic" refers to aromatic or non-aromatic rings or fused ring systems of up to 14, preferably up to 10, most preferably up to 6 atoms selected from C, N, O, and S. As is well understood in this technical area, a large degree of substitution is not only tolerated, but is often advisable. As a means of simplifying the discussion, the terms, "nucleus", "groups" and "moiety" are used to differentiate between chemical species that allow for substitution or which may be substituted and those which do not or may not be so substituted. For example, the phrase "alkyl group" is intended to include not only pure hydrocarbon alkyl chains, such as methyl, ethyl, octyl, cyclohexyl, iso-octyl, t-butyl and the like, but also alkyl chains bearing conventional substitutents known in the art, such as hydroxyl, alkoxy, phenyl, halogen (F, Cl, Br and I), cyano, nitro, amino etc. The term "nucleus" is likewise considered to allow for substitution. The phrase "alkyl moiety" on the other hand is limited to the inclusion of only pure hydrocarbon alkyl chains, such as methyl, ethyl, propyl, cyclohexyl, iso-octyl, t-butyl etc.

Compounds of formula (IV) are found to bleach cationic dyes (particularly those of formulae (I) and (II)) rapidly and cleanly when the latter are photoexcited, but are stable towards the dyes at room temperature in the dark. Furthermore, they are readily synthesized, stable compounds and do not give rise to colored degradation products, and so are well suited for use in media that generate colored images.

For embodiments wherein compounds of formula (IV) function as a latent curing agent (i.e., crosslinking agent) for a resin having a plurality of hydroxy groups in addition to being a photoreducing agent, $R^5$ is selected from the group of H, an alkyl group, a cycloalkyl group, and an aryl group; $R^6$ is an aryl group; each $R^7$ and $R^8$ is independently an alkyl group or an aryl group; and Z is an oxygen atom. For certain embodiments of the photoreducing agent or latent curing agent, Z is preferably an oxygen atom, $R^5$ is preferably H or phenyl (optionally substituted), $R^6$ is preferably phenyl (optionally substituted), $R^7$ is preferably lower alkyl (especially methyl) and $R^8$ is preferably lower alkyl (e.g., ethyl). In certain preferred embodiments, particularly for use as a latent curing agent, $R^5$ is not H.

Although it is not intended that the invention should be limited to any particular curing mechanism, it is believed that the latent curing agents of formula (IV) are oxidized in the course of laser irradiation of the transfer media, forming the corresponding pyridinium salts which have a positive charge associated with the pyridine ring. The presence of this positive charge activates the ester side chains towards transesterification reactions with the hydroxy-functional resin, leading to crosslinking and hardening of the resin. This mechanism may be summarized as follows:

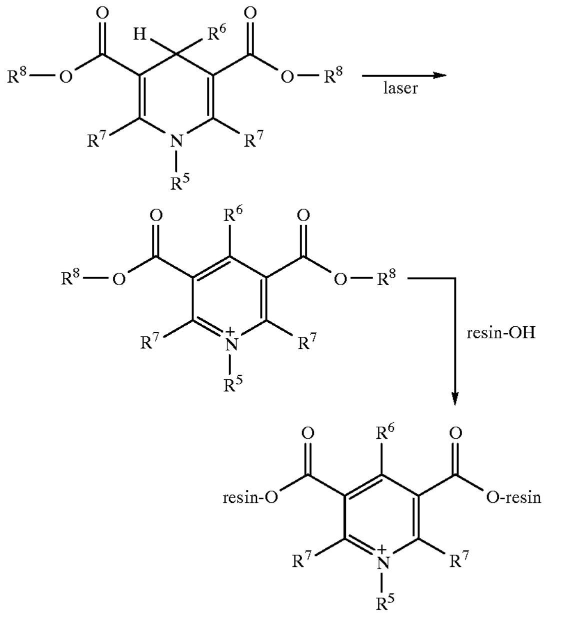

Evidence for this proposed mechanism comes from the fact that in the absence of laser irradiation, the transfer media show little or no tendency for thermal curing, and that the compounds in which $R^5$ is H (which may be oxidized to neutral pyridine derivatives) appear to be less active as curing agents than the corresponding N-alkyl and N-aryl derivatives. As used herein, a latent curing agent is one that is typically only reactive in the system under conditions of laser address.

For the latent curing agents of formula (IV), $R^5$ is preferably any group compatible with formation of a stable pyridinium cation, which includes essentially any alkyl, cycloalkyl or aryl group, but for reasons of cost and convenience, lower alkyl groups having 1 to 5 carbon atoms (such as methyl, ethyl, propyl, etc.) or simple aryl groups (such as phenyl, tolyl, etc.) are preferred. Similarly, $R^7$ may represent essentially any alkyl or aryl group, but lower alkyl groups of 1 to 5 carbon atoms (such as methyl, ethyl, etc.) are preferred for reasons of cost and ease of synthesis. $R^8$ may also represent any alkyl or aryl group, but is preferably selected so that the corresponding alcohol or phenol, $R^8$—OH, is a good leaving group, as this promotes the transesterification reaction believed to be central to the curing mechanism. Thus, aryl groups comprising one or more electron-attracting substituents such as nitro, cyano, or fluorinated substituents, or alkyl groups of up to 10 carbon atoms are preferred. Most preferably, each $R^8$ represents lower alkyl group such as methyl, ethyl, propyl, etc., such that $R^8$—OH is volatile at temperatures of about 100° C. and above. $R^6$ may represent any aryl group such as phenyl, naphthyl, etc., including substituted derivatives thereof, but is most conveniently phenyl.

Analogous compounds in which $R^6$ represents H or an alkyl group are not suitable for use in the invention (either as a photoreducing agent or as a latent curing agent), because such compounds react at ambient or moderately elevated temperatures with many of the infrared dyes suitable for use in the invention, and hence the relevant compositions have a limited shelf life. In contrast, the compounds in which $R^6$ is an aryl group are stable towards the relevant dyes in their ground state, and the relevant compositions have a good shelf life.

Compounds of formula (IV) may be synthesized by co-condensation of an aldehyde, an amine and two equivalents of a beta-ketoester in an adaptation of the well known Hantsch pyridine synthesis:

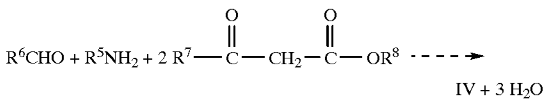

The compounds of formula (IV) are typically coated in the same layer or layers as the dye, but may additionally or alternatively be present in one or more separate layers, provided that reactive association of the dye and reducing agent and/or resin and latent curing agent is possible during the photoirradiation. Preferably, these materials are in one layer, although absorption of laser pulses can cause extremely rapid rises in temperature and pressure, which may readily enable the ingredients of two or more adjacent layers to mix and interact.

Preferably, at least one mole of reducing agent is present per mole of dye, but more preferably an excess is used, e.g., in the range of 5-fold to 50-fold. Also, a metal salt stabilizer may be incorporated, e.g., a magnesium salt, as this has been found to improve the thermal stability of the system without affecting the photoactivity. Quantities of about 10 mole % based on the compound of formula IV are effective.

The remaining essential ingredient for embodiments of laser addressable thermal imaging media for which curing (i.e., crosslinking) is desired is a resin having a plurality of hydroxy groups. Depending on the intended end use, the presence or absence of other binder resins, etc., this may be selected from a wide variety of materials. Prior to laser address, the media ideally should be in the form of a smooth, tack-free coating, with sufficient cohesive strength and durability to resist damage by abrasion, peeling, flaking, dusting, etc. in the course of normal handling and storage. If the hydroxy-functional resin is the sole or major resin component (which is the preferred situation), then its physical and chemical properties should be compatible with the above requirements. Thus, film-forming polymers with glass transition temperatures higher than ambient temperature are preferred. The polymers should be capable of dissolving or dispersing the other components of the transfer media, and should themselves be soluble in the typical coating solvents such as lower alcohols, ketones, ethers, hydrocarbons, haloalkanes, and the like.

The hydroxy groups may be alcohol groups or phenol groups (or both), but alcohol groups are preferred. The requisite hydroxy groups may be incorporated in a polymeric resin by polymerization or copolymerization of hydroxy-functional monomers such as allyl alcohol and hydroxyalkyl acrylates or methacrylates, or by chemical conversion of preformed polymers, e.g., by hydrolysis of polymers and copolymers of vinyl esters such as vinyl acetate. Polymers with a high degree of hydroxyl functionality, such as poly(vinyl alcohol), cellulose, etc., are in principle suitable for use in the invention, but in practice their solubility and other physico-chemical properties are less than ideal for most applications. Derivatives of such polymers, obtained by esterification, etherification or acetalization of the bulk of the hydroxy groups, generally exhibit superior solubility and film-forming properties, and provided that at least a minor proportion of the hydroxy groups remain unreacted, they are suitable for use in the invention. Indeed, the preferred hydroxy-functional resin for use in the invention belongs to this class, and is the product formed by reacting poly(vinyl alcohol) with butyraldehyde. Commercial grades of this polyvinyl butyral (supplied by Monsanto under the trade designation BUTVAR) typically leave at least 5% of the hydroxy groups unreacted and combine solubility in common organic solvents with excellent film-forming and pigment-dispersing properties.

Alternatively, a blend of "inert" and hydroxy-functional resins may be used, in which the inert resin provides the requisite film-forming properties, which may enable the use of lower molecular weight polyols, but this is not preferred.

The laser-addressable thermal imaging media may comprise any imaging media in which photothermal conversion is used to generate an image. The invention finds particular use with media which generate a color image which may be altered by the presence of unbleached photothermal converting dye. Such media may take several forms, such as colorant transfer systems, peel-apart systems, phototackification systems and systems based on unimolecular thermal fragmentations of specific compounds.

Preferred laser addressable thermal imaging media include the various types of laser thermal transfer media. In these systems, a donor sheet comprising a layer of colorant and a suitable absorber is placed in contact with a receptor and the assembly exposed to a pattern of radiation from a scanned laser source. The radiation is absorbed by the absorber, causing a rapid build-up of heat in the exposed areas of the donor which in turn causes transfer of colorant from those areas to the receptor. By repeating the process with one or more different-colored donors, a multicolor image can be assembled on a common receptor. The system is particularly suited to the color proofing industry, where color separation information is routinely generated and stored electronically, and the ability to convert such data into hardcopy via digital address of "dry" media is particularly advantageous.

The heat generated may cause colorant transfer by a variety of mechanisms. For example, there may be a rapid build up of pressure as a result of decomposition of binders or other ingredients to gaseous products, causing physical propulsion of colorant material to the receptor ("ablation transfer"), as described in U.S. Pat. No. 5,171,650 and WO90/12342. Alternatively, the colorant and associated binder materials may transfer in a molten state ("melt-stick transfer"), as described in JP63-319191. Both of these mechanisms produce mass transfer, i.e., there is essentially 0% or 100% transfer of colorant depending on whether the applied energy exceeds a certain threshold. A somewhat different mechanism is diffusion or sublimation transfer, whereby a colorant is diffused (or sublimed) to the receptor without co-transfer of binder. This is described, for example, in U.S. Pat. No. 5,126,760, and enables the amount of colorant transferred to vary (continuously with the input energy.

Any of the donor element constructions known in the art of laser thermal transfer imaging may be used in the present invention. Thus, the donor may be adapted for sublimation transfer, ablation transfer, or melt-stick transfer, for example. Typically, the donor element comprises a substrate (such as polyester sheet), a layer of colorant, a dye (preferably cationic) as photothermal converter, and a reducing agent and/or curing agent. As is apparent from the discussion above, the reducing agent and the curing agent may be the same compound. The dye and reducing agent and/or latent curing agent may be in the same layer as the colorant, in one or more separate layers, or both. Other layers may be present, such as dynamic release layers as taught in U.S. Pat. No. 5,171,650. Alternatively, the donor may be self-sustaining, as taught in EP-A-0491564. The colorant generally comprises one or more dyes or pigments of the desired color dissolved or dispersed in a binder, although binder-free colorant layers are also possible, as taught in International Patent Application No. PCT/GB92/

01489. Preferably the colorant comprises dyes or pigments that reproduce the colors shown by standard printing ink references provided by the International Prepress Proofing Association, known as SWOP color references. Essentially any dye or pigment or mixture of dyes and/or pigments of the desired hue may be used as a colorant in the transfer media, but pigments in the form of dispersions of solid particles are particularly preferred. Solid-particle pigments typically have a much greater resistance to bleaching or fading on prolonged exposure to sunlight, heat, humidity, etc. in comparison to soluble dyes, and hence can be used to form durable images.

Particularly preferred donor elements are of the type described in EP-A-0602893 in which the colorant layer comprises a fluorocarbon compound in addition to pigment and binder. The use of such an additive in an amount corresponding to at least one part by weight per 20 parts by weight of pigment, preferably at least one part per 10 parts pigment, provides much improved resolution and sensitivity in the laser thermal transfer process. Preferred fluorochemical additives comprise a perfluoroalkyl chain of at least six carbon atoms attached to a polar group, such as carboxylic acid, ester, sulphonamide, etc.

Minor amounts of other ingredients may optionally be present in the transfer media, such as surfactants, coating aids, pigment dispersing aids, etc., in accordance with known techniques.

Transfer media suitable for use in the invention are formed as a coating on a support. The support may be any sheet-form material of suitable thermal and dimensional stability, and for most applications should be transparent to the exposing laser radiation. Polyester film base, of about 20 $\mu$m to about 200 $\mu$m thickness, is most commonly used, and if necessary may be surface-treated so as to modify its wettability and adhesion to subsequently applied coatings. Such surface treatments include corona discharge treatment, and the application of subbing layers or release layers, including dynamic release layers as taught in U.S. Pat. No. 5,171,650.

The relative proportions of the components of the transfer medium may vary widely, depending on the particular choice of ingredients and the type of imaging required. For example, transfer media designed for color proofing purposes typically have a high pigment to binder ratio, and may not require a high degree of curing in the transferred image. Regardless of the end use, the infrared dye should be present in sufficient quantity to provide a transmission optical density of at least 0.5, preferably at least 1.0, at the exposing wavelength. Transfer media intended for color imaging preferably contain sufficient colorant to provide a reflection optical density of at least 0.5, preferably at least 1.0, at the relevant viewing wavelength(s).

The relative proportions of the components of the laser addressable thermal imaging layer may vary widely, depending on the particular choice of ingredients and the type of imaging required. Preferred pigmented media for use in the invention have the following approximate composition (in which all percentages are by weight):

| | |
|---|---|
| hydroxy-functional film-forming resin (e.g., BUTVAR B76) | 35 to 65% |
| latent curing agent | up to 30% |
| infrared dye | 3 to 20% |
| pigment | 10 to 40% |
| pigment dispersant (e.g., DISPERBYK 161) | 1 to 6% |
| fluorochemical additive (e.g., a perfluoroalkylsulphonamide) | 1 to 10% |

Thin coatings (e.g., of less than about 3 $\mu$m dry thickness) of the above formulation may be transferred to a variety of receptor sheets by laser irradiation. Transfer occurs with high sensitivity and resolution, and heating the transferred image for relatively short periods (e.g., one minute or more) at temperatures in excess of about 120° C. causes curing and hardening, and hence an image of enhanced durability.

Transfer media for use in the invention are readily prepared by dissolving or dispersing the various components in a suitable organic solvent and coating the mixture on a film base. Pigmented transfer media are most conveniently prepared by predispersing the pigment in the hydroxy-functional resin in roughly equal proportions by weight, in accordance with standard procedures used in the color proofing industry, thereby providing pigment "chips." Milling the chips with solvent provides a millbase, to which further resin, solvents, etc. are added as required to give the final coating formulation. Any of the standard coating methods may be employed, such as roller coating, knife coating, gravure coating, bar coating, etc., followed by drying at moderately elevated temperatures.

A wide variety of receptor sheets may be used in the practice of the invention. For color imaging, the receptor is preferably paper (plain or coated) or a plastic film coated with a thermoplastic receiving layer, and may be transparent or opaque. Nontransparent receptor sheets may be diffusely reflecting or specularly reflecting. When the receptor sheet comprises a paper or plastic sheet coated with a thermoplastic receiving layer, the receiving layer is typically several microns thick, and may comprise any thermoplastic resin capable of providing a tack-free surface at ambient temperatures, and which is compatible with the transferred colorant. Preferably, the receiving layer comprises the same resin(s) as used as the binder(s) of the colorant transfer layer.

When a receiving layer is present, it may advantageously contain a thermal bleaching agent for the infrared dye, as disclosed in EP-A-0675003 and British Patent Application No. 9617416 filed Aug. 20, 1996. Preferred bleach agents include amines, such as, diphenylguanidine and salts thereof. The bleach agents are typically used at a loading equivalent to about 5 wt % to about 20 wt % of the receptor layer. This complements the photoredox bleaching provided by the present invention.

The choice of the resin for the receptor layer (e.g., in terms of Tg, softening point, etc.) may depend on the type of transfer involved (ablation, melt-stick, or sublimation). A wide variety of polymers may be employed, provided that a clear, colorless, nontacky film is produced. Within these constraints, selection of polymers for use in the receptor layer is governed largely by compatibility with the colorant intended to be transferred to the receptor, and with the bleaching agent, if used. Vinyl polymers such as polyvinyl butyral (e.g., BUTVAR B-76 supplied by Monsanto), vinyl acetate/vinyl pyrrolidone copolymers (e.g., E735, E535 and E335 supplied by GAF) and styrene butadiene polymers (e.g., PLIOLITE S5A supplied by Goodyear) have been found to be particularly suitable.

The receptor sheet may be textured or otherwise engineered so as to present a surface having a controlled degree of roughness, e.g., by incorporating polymer beads, silica particles, etc. in the receiving layer, disclosed, for example, in U.S. Pat. No. 4,876,235. Alternatively, roughening agents may be incorporated in the transfer medium, as disclosed in EP0163297, EP0679531, and EP0679532. When one (or both) of the donor and receptor sheets presents a roughened surface, vacuum draw-down of the one to the other is facilitated. Preferred texturizing material are polymeric beads chosen such that substantially all of the visible wavelengths (400 nm to 700 nm) are transmitted through the material to provide optical transparency. Nonlimiting examples of polymeric beads that have excellent optical transparency include polymethylmethacrylate and polystyrene methacrylate beads, described in U.S. Pat. No. 2,701, 245; and beads comprising diol dimethacrylate homopolymers or copolymers of these diol dimethacrylates with long chain fatty alcohol esters of methacrylic acid and/or ethylenically unsaturated comonomers, such as stearyl methacrylate/hexanediol diacrylate crosslinked beads, as described in U.S. Pat. No. 5,238,736 and U.S. Pat. No. 5,310,595.

A suitable receptor layer comprises PLIOLITE S5A containing diphenylguanidine as bleach agent (10 wt % of total solids) and beads of poly(stearyl methacrylate) (8 $\mu$m diameter) (about 5 wt % of total solids), coated at about 5.9 g/m$^2$.

The procedure for imagewise transfer of colorant from donor to receptor is entirely conventional. The two elements are assembled in intimate face-to-face contact, e.g., by vacuum draw down, or alternatively by means of cylindrical lens apparatus as described in U.S. Pat. No. 5,475,418, and scanned by a suitable laser. The assembly may be imaged by any of the commonly used lasers, depending on the absorber used, but address by near infrared and infrared emitting lasers such as diode lasers and YAG lasers, is preferred. Best results are obtained from a relatively high intensity laser exposure, e.g., of at least $10^{23}$ photons/cm$^2$/second. For a laser diode emitting at 830 nm, this corresponds approximately to an output of 0.1 W focused to a 20 micron spot with a dwell time of approximately 1 microsecond. In the case of YAG laser exposure at 1064 nm, a flux of at least $3\times10^{24}$ photons/cm$^2$/second is preferred, corresponding roughly to an output of 2 W focused to a 20 micron spot, with a dwell time of approximately 0.1 microsecond.

Any of the known scanning devices may be used, e.g., flat-bed scanners, external drum scanners or internal drum scanners. In these devices, the assembly to be imaged is secured to the drum or bed (e.g., by vacuum draw-down) and the laser beam is focused to a spot (e.g., of about 10–25, preferably about 20 microns diameter) on the IR-absorbing layer of the donor. This spot is scanned over the entire area to be imaged while the laser output is modulated in accordance with electronically stored image information. Two or more lasers may scan different areas of the donor-receptor assembly simultaneously, and if necessary, the output of two or more lasers may be combined optically into a single spot of higher intensity. Laser address is normally from the donor side, but may alternatively be from the receptor side if the receptor is transparent to the laser radiation. Peeling apart the donor and receptor reveals a monochrome image on the receptor. The process may be repeated one or more times using donor sheets of different colors to build a multicolor image on a common receptor. Because of the interaction of the photothermal converting dye and reducing agent during laser address, the final image can be free from contamination by the photothermal converter.

Although any form of laser-mediated mass transfer may be suitable for the practice of the invention, curing and hardening of the transferred image is most effective when each pixel of the image remains substantially intact and coherent during the transfer from the donor to the receptor. Thus melt-stick transfer, in which the pixels are transferred in a molten or semi-molten state, is preferable to ablation transfer, which involves an explosive decomposition and/or vaporization of the imaging medium, and hence results in fragmentation of the transferred pixels. Factors which favor the melt-stick mechanism include the use of less-powerful lasers (or shorter scan times for a given laser output) and the absence from the imaging medium of binders which are self-oxidizing or otherwise thermally degradable, such as, those disclosed in WO90/12342.

After peeling the donor sheet from the receptor, the image residing on the receptor is preferably further cured by subjecting it to heat treatment, preferably at temperatures in excess of about 120° C. This may be carried out by a variety of means, such as storage in an oven, hot air treatment, contact with a heated platen or passage through a heated roller device. In the case of multicolor imaging, where two or more monochrome images are transferred to a common receptor, it is more convenient to delay the curing step until all the separate colorant transfer steps have been completed, then provide a single heat treatment for the composite image. However, if the individual transferred images are particularly soft or easily damaged in their uncured state, then it may be necessary to cure and harden each monochrome image prior to transfer of the next, but in preferred embodiments of the invention, this is not necessary.

In some situations, the receptor to which a colorant image is initially transferred is not the final substrate on which the image is viewed. For example, U.S. Pat. No. 5,126,760 discloses thermal transfer of a multicolor image to a first receptor, with subsequent transfer of the composite image to a second receptor for viewing purposes. If this technique is employed in the practice of the present invention, curing and hardening of the image may conveniently be accomplished in the course of the transfer to the second receptor. In this embodiment of the invention, the second receptor may be a flexible sheet-form material such as paper, card, plastic film, etc.

Advantages of the invention are illustrated by the following examples. However, the particular materials and amounts thereof recited in these examples, as well as other conditions and details, are to be interpreted to apply broadly in the art and should not be construed to unduly limit the invention.

EXAMPLES

The following materials are used in the Examples:

Dye 1

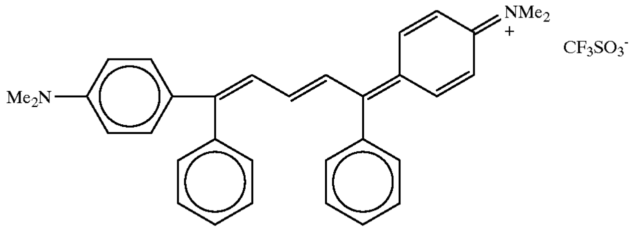

-continued
Dye 2
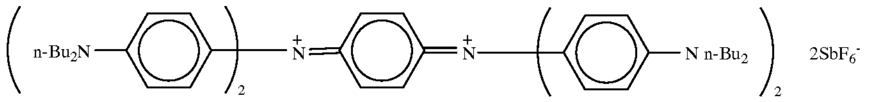
(Supplied under the trade name CYASORB IR165 by American Cyanamid).
Dye 3
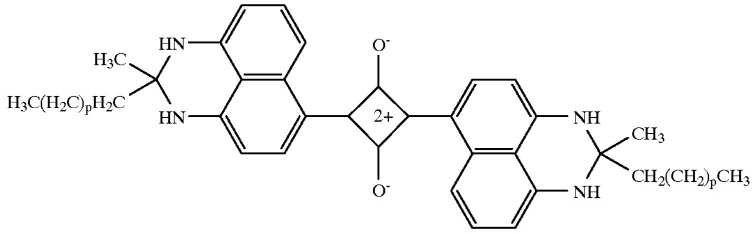
wherein: p = 9
Dye 4
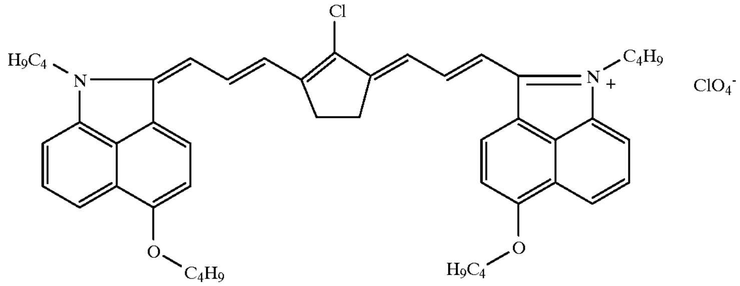
Compound 1(a)–1(e):
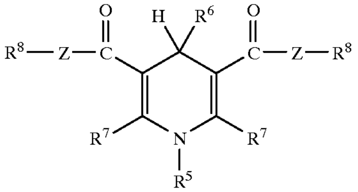
| | $R^5$ | $R^6$ | $R^7$ | $R^8$ | Z |
|---|---|---|---|---|---|
| 1(a) | H | Ph | Me | Et | O |
| 1(b) | Ph | Ph | Me | Et | O |
| 1(e) | H | 3,4-$(OH)_2C_6H_4$ | Me | Et | O |
| 1(d) | H | Ph | Me | Me | — |
| 1(e) | Me | Ph | Me | Et | O |
Compound 2
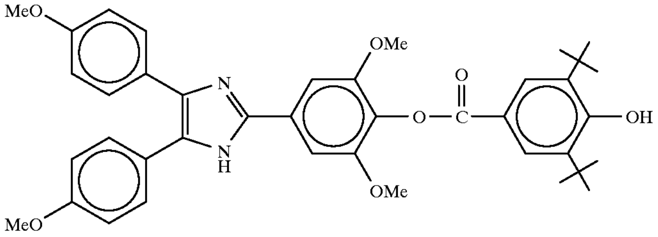

-continued

Compound 3-(EP-A-0681210)

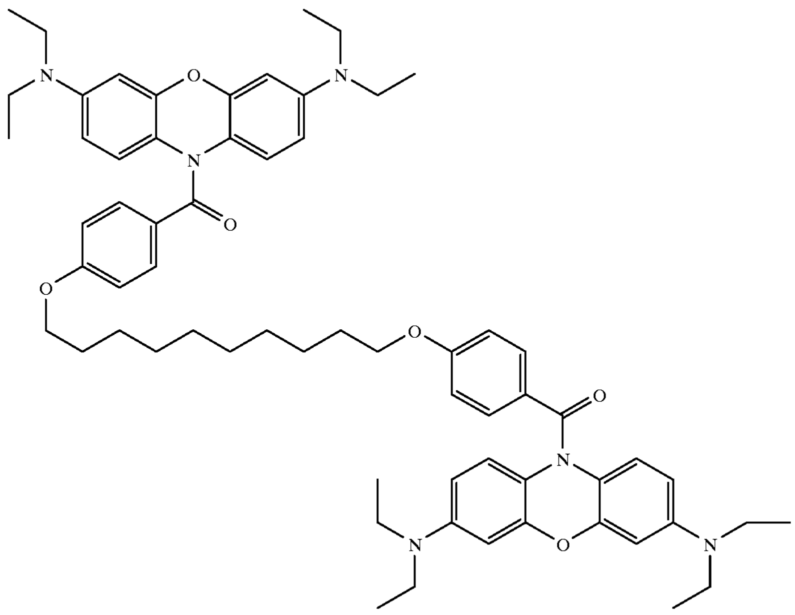

| | |
|---|---|
| BUTVAR B-76 | polyvinylbutyral (Monsanto), with free OH content of 7 to 13 mole % |
| DISPERBYK 161 | dispersing agent supplied by BYK-Chemie |
| VAGH and VYNS | vinyl copolymers resins supplied by Union Carbide |
| MEK | methyl ethyl ketone (2-butanone) |
| FC | N-methylperfluorooctanesulphonamide |
| PET | polyethyleneterephthalate film |

Example 1

This example demonstrates the photoreductive bleaching of Dyes 1 and 2 by Compounds 1(a) and 2 (i.e., Donors 1(a) and 2). The following formulations were coated on 100 micrometer unsubbed polyester base at 12 micrometer wet thickness and air dried to provide Elements 1–4:

| | Element 1 | Element 2 | Element 3 | Element 4(c) |
|---|---|---|---|---|
| BUTVAR B76 (10% w/w in MEK) | 2.75 g | — | 5.5 g | 5.5 g |
| MEK | 2.75 g | 5.5 g | 3.5 g | 3.5 g |
| Ethanol | — | 0.5 g | — | — |
| Dye 1 | 0.08 g | 0.125 g | — | — |
| Dye 2 | — | — | 0.25 g | 0.25 g |
| Compound 1(a) | 0.4 g | — | 0.68 g | — |
| Compound 2 | — | 0.10 g | — | — |

Element 4 is a control (c) as there is no photoreducing agent (i.e., donor) present. Elements 1 and 2 were pale blue/pink in appearance and Elements 3 and 4 pale grey. Samples measuring 5 cm ×5 cm were mounted on a drum scanner and exposed by a 20 micron laser spot scanned at various speeds. The source was either a laser diode delivering 115 mW at 830 nm at the image plane (Elements 1 and 2), or a YAG laser delivering 2 W at 1068 nm (Elements 3 and 4). The results are reported in the following table in which OD represents optical density:

| | Element 1 | Element 2 |
|---|---|---|
| OD (830 nm) (initial) | 1.9 | 1.3 |
| OD after 600 cm/sec scan | 1.7 | 1.2 |
| OD after 400 cm/sec scan | 1.5 | 0.6 |
| OD after 200 cm/sec scan | 0.7 | 0.3 |
| | **Element 3** | **Element 4(c)** |
| OD (1100 nm) (initial) | 1.3 | 1.3 |
| OD after 6400 cm/sec scan | 0.9 | 1.3 |
| OD after 3200 cm/sec scan | 0.6 | 1.1 |

In the case of Elements 1–3, colorless tracks were formed in the exposed areas, with the degree of bleaching correlating with scan speed, whereas Element 4 (a control lacking a donor compound) showed negligible bleaching. It is noteworthy that Donor 2, which may be regarded as an aroyl-protected leuco dye, did not give rise to any coloration attributable to the corresponding dye.

The preparation and imaging of Element 1 was repeated, substituting Compounds 1(b)–1(d) for Compound 1(a), all of which function as photoreducing donors, giving similar results.

Example 2

This example demonstrates the photoreductive bleaching of Dyes 3 and 4 by Compound 3, which may be regarded as an acyl-protected leuco phenoxazine dye. Elements 5 and 6 were prepared in the same manner as Elements 1–4 from the following formulations:

| | Element 5 | Element 6 |
|---|---|---|
| MEK | 4.0 g | 4.0 g |
| Ethanol | 0.3 g | 0.4 g |
| Dye 3 | 0.08 g | — |
| Dye 4 | — | 0.1 g |
| Compound 3 | 0.05 g | 0.1 g |

Laser diode irradiation at a scan speed of 200 cm/second (as described in Example 1) produced the following changes in optical density:

| | OD change (670 nm) | OD change (IR band) |
|---|---|---|
| Element 5 | <0.1 | −1.2 |
| Element 6 | <0.1 | −0.8 |

Thus, efficient bleaching of the IR dye was observed, with no significant build up of dye density attributable to the phenoxazine dye corresponding to Compound 3.

Example 3

The example demonstrates thermal transfer media in accordance with the invention. A millbase was prepared by dispersing 4 grams of magenta pigment chips in 32 grams of MEK using a McCrone Micronising Mill. The pigment chips were prepared by standard procedures and comprised blue shade magenta pigment and VAGH binder in a weight ratio of 3:2. The following formulations were prepared and coated as described in Example 1 (except the FC was added after the other ingredients had been mixed for 30 minutes under low light conditions) to give Elements 7–10:

| | Element 7 | Element 8(c) | Element 9 | Element 10(c) |
|---|---|---|---|---|
| Millbase | 5.5 g | 5.5 g | 5.5 g | 5.5 g |
| MEK | 2.0 g | 2.0 g | 2.0 g | 2.0 g |
| Ethanol | 1.0 | 1.01 | 1.0 g | 1.0 g |
| Dye 1 | 0.125 g | 0.125 g | — | — |
| Dye 2 | — | — | 0.2 g | 0.2 g |
| Compound 1(a) | 0.6 g | — | 0.6 g | — |
| FC | 0.025 g | 0.025 g | 0.025 g | 0.025 g |

(c) = control without donor (not in accordance with invention)

Samples of the resulting coatings were assembled in contact with a VYNS-coated paper receptor and mounted on an external drum scanner with vacuum hold-down, then addressed with a laser diode (830 nm, 110 mW, 20 micrometer spot) scanned at 100 or 200 cm/second. The receptor sheets, after peeling from the donors, showed lines of magenta pigment contaminated to varying extents by Dye 1 or Dye 2. The degree of contamination was assessed by measuring the reflection density of the transferred tracks at 830 nm or 1050 nm as appropriate:

| | 200 cm/sec | 100 cm/sec |
|---|---|---|
| Element 7 | 0.3 | 0.1 |
| Element 8(c) | 0.8 | 0.6 |
| Element 9 | 0.8 | 0.4 |
| Element 10(c) | 1.5 | 1.4 |

The elements of the invention show much reduced contamination by the IR dye, and purer magenta images were obtained.

Example 4

This example demonstrates the crosslinking of BUTVAR B-76 polyvinyl butyral resin in accordance with the invention. A solution of BUTVAR B-76 resin (7.5 wt %) in MEK was prepared, and to each of 3 separate 5.0 gram aliquots was added 0.1 gram infrared dye Dye 1 and a further 1.0 gram of MEK, together with a test compound as follows:

| | | |
|---|---|---|
| (a) | (control) | none |
| (b) | (invention) | latent curing agent (Compound 1(b)) |
| (c) | (invention) | latent curing agent (Compound 1(e)) |

The resulting solutions were bar coated at 36 $\mu$m wet thickness on PET base and dried for 3 minutes at 60° C. Each coating was exposed on an external drum scanner equipped with a 116 mW diode laser emitting at 830 nm and focused to a 20 $\mu$m spot, the scan rate being varied in the range of 100 cm/second to 400 cm/second. The imaged coatings were placed in an oven at 130° C. for 3 minutes, then developed in acetone to remove uncured areas of the coatings. Images were observed as follows:

(a) (control)—traces of image for 100 cm/sec scan (b) (invention)—tough, well-defined image for 100 cm/sec scan (c) (invention)—tough, well-defined image for 200 cm/sec scan The results clearly demonstrate the effectiveness of the above-identified donors (Compounds 1(b) and 1(e)) as latent curing agents.

Example 5

This example demonstrates pigmented transfer media in accordance with the invention. In the following formulations, all parts are by weight.

A magenta millbase was prepared by milling pigment (360 parts) with BUTVAR B-76 resin (240 parts) in the presence of DISPERBYK 161 dispersing agent (101 parts) and 1-methoxypropan-2-ol (100 parts) on a two-roll mill. The "chips" produced were dispersed in a 1:1 mixture (by weight) of MEK and 1-methoxypropan-2-ol to provide a millbase comprising 15% solids (by weight).

To 400 parts millbase was added 260 parts 15 wt % BUTVAR B-76 in MEK, 1480 parts additional MEK, 36 parts infrared dye Dye 1, 36 parts latent curing agent (Compound 1 (b)), and 180 parts ethanol. After stirring to allow the dye to dissolve, 7.2 parts N-methylperfluorooctylsulphonamiide was added, and the mixture bar coated on 50 $\mu$m PET base to provide a thickness of about 1 $\mu$m after drying at 93° C.

A control donor sheet was prepared similarly, but omitting the latent curing agent (Compound 1(b)).

A sample of each donor sheet was mounted in face-to-face contact with a receptor sheet (comprising a layer of BUTVAR B-76 resin coated on a paper base) on an external drum scanner, and scanned at 300 cm/second with a diode laser delivering 220 mW at 830 nm, focused to a 20 $\mu$m spot. Separation of the donors and receptors revealed magenta images on the receptors corresponding to the laser tracks. Each image-bearing receptor was cut in half, and one half place in an oven at 160° C. for 3 minutes. Inspection of the unheated images revealed that both were relatively soft and easily damaged, e.g., with a fingernail. Inspection of the heated images revealed that those obtained from the control donor sheet were still soft and easily damaged, whereas that obtained from the donor sheet of the invention was hard and abrasion resistant.

Example 6

Cyan, magenta, yellow and black (CMYK) donor sheets were prepared with weight percentages of components listed in the following Table in the thermofusible colorant layer coated at about 1 μm PET base to SWOP specifications for web off-set printing.

Exposure using Presstek PEARLSETTER 74 running at various scan rates (100 to 500 cm/second) and laser power of 500 mW, 30 micrometer, 870 nm, transfer was effected in the order C, M, Y, K to Schoeller 170 M base, the donor-receptor being held in tension together. Blocks of color ($10 \times 20$ mm$^2$) were imaged over a range of scan speeds (100 to 500 cm/second). A second set from a different color were directly overprinted the first at same scan speed.

Successful overprint of C, M, Y, K was achieved with no defects observable over an A2 imaging area, over all scanning speed (100 to 500 cm/second).

| Millbases: | |
|---|---|
| **Red Shade Cyan Millbase** | |
| Red Shade Cyan Pigment | 7.77 g |
| BUTVAR B76 | 7.77 g |
| DISPERSBYK 161 | 0.47 g |
| MEK | 42.0 g |
| 1-methoxy-2-propanol | 42.0 g |
| **Phthalo Green Millbase** | |
| Phthalo Green Pigment | 7.86 g |
| BUTVAR B76 | 7.86 g |
| DISPERSBYK 161 | 0.47 g |
| MEK | 41.9 g |
| 1-methoxy-2-propanol | 41.9 g |
| **Red Shade Magenta Millbase** | |
| Red Shade Magenta Pigment | 7.78 g |
| BUTVAR B76 | 7.78 g |
| DISPERSBYK 161 | 0.93 g |
| MEK | 41.8 g |
| 1-methoxy-2-propanol | 41.8 g |
| **Blue Shade Magenta Millbase** | |
| Blue Shade Magenta Pigment | 7.36 g |
| BUTVAR B76 | 7.36 g |
| DISPERSBYK 161 | 0.88 g |
| MEK | 42.2 g |
| 1-methoxy-2-propanol | 42.2 g |
| **Black Millbase** | |
| Carbon Black Pigment | 9.88 g |
| BUTVAR B76 | 9.88 g |
| DISPERSBYK 161 | 1.03 g |
| MEK | 39.6 g |
| 1-methoxy-2-propanol | 39.6 g |
| **Green Shade Yellow Millbase** | |
| Green Shade Yellow Pigment | 7.28 g |
| BUTVAR B76 | 7.28 g |
| DISPERSBYK 161 | 0.44 g |
| MEK | 42.5 g |
| 1-methoxy-2-propanol | 42.5 g |
| **Red Shade Yellow Millbase** | |
| Red Shade Yellow Pigment | 7.28 g |
| BUTVAR B76 | 7.28 g |
| DISPERSBYK 161 | 0.44 g |
| MEK | 42.5 g |
| 1-methoxy-2-propanol | 42.5 g |

-continued

| | Cyan (wgt. in grams) | Magenta (wgt. in grams) | Yellow (wgt. in grams) | Black (wgt. in grams) |
|---|---|---|---|---|
| Red Shade Cyan Millbase (16% solids in MEK) | 12.05 | | | 5.16 |
| Phthalo Green Millbase (16.2% solids in MEK) | 1.48 | | | |
| Red Shade Magenta Millbase (16.5% solids in MEK) | | 20.18 | | |
| Blue Shade Magenta Millbase (15.6% solids in MEK) | | 22.02 | | 1.51 |
| Carbon Black Millbase (20.8% solids in MEK) | | 0.15 | | 20.09 |
| Green Shade Yellow Millbase (15% solids in MEK) | | | 30.75 | |
| Red Shade Yellow Millbase (15% solids in MEK) | | | 2.69 | |
| BUTVAR B76 (15% solids in MEK; polyvinyl butyral, available from Monsanto) | 17.4 | 0.02 | 8.91 | 6.57 |
| IR Dye | 1.07 | 1.23 | 1.28 | 0.53 |
| Dihydropyridine | 0.39 | 0.61 | 0.51 | 0.45 |
| Fuorocarbon surfactant (7.5% solids in MEK) | 0.67 | 0.67 | 0.67 | 0.67 |
| Fluorocarbon polymer (50% solids in MEK) | 0.52 | 0.52 | 0.73 | 0.6 |
| Methyl ethyl ketone (MEK) | 50.09 | 44.98 | 55.14 | 56.41 |
| Ethanol | 9 | 9 | 9 | 9 |
| 1-methoxy-2-propanol | 8 | | | |

Example 7

A receptor was prepared by coating the following formulation from methylethyl ketone (18 wt %) onto 100 μm PET base to provide a dry coating weight of 400 mg/ft$^2$ (4.3 g/m$^2$):

| | |
|---|---|
| PLIOLITE S5A | 87 wt % |
| Poly(stearyl methacrylate) beads (8μ diameter) | 1 wt % |
| Diphenylguanidine | 12 wt % |

The receptor was imaged under the conditions of Example 6 using the cyan, magenta, yellow and black donor sheets. The resulting image was transferred to opaque MATCHPRINT Low Gain base under heat and pressure by passing the receptor and base in contact through a MATCHPRINT laminator. The sheets were peeled apart and the transferred image inspected. The quality of the transferred image was excellent, having good color rendition with no contamination from the IR dye. No dust artefacts were apparent.

The complete disclosure of all patents, patent documents, and publications cited herein are incorporated by reference. The foregoing detailed description and examples have been given for clarity of understanding only. No unnecessary limitations are to be understood therefrom. The invention is not limited to the exact details shown and described, for variations obvious to one skilled in the art will be included within the invention defined by the claims.

What is claimed is:

1. A laser addressable thermal imaging element comprising a bleachable photothermal converting dye in association with a heat-sensitive imaging medium, and a photoreducing agent for said dye, said photoreducing agent bleaching said dye, on laser address of the element; wherein the photoreducing agent is a compound having the formula:

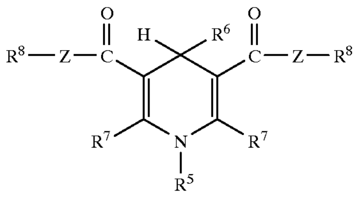

wherein:

$R^5$ is selected from the group of H, alkyl, aryl, alicyclic, and heterocyclic groups;

$R^6$ is an aryl group;

each $R^7$ and $R^8$ is independently selected from the group of alkyl, aryl, alicyclic, and heterocyclic groups; and Z is a covalent bond or an oxygen atom.

2. The thermal imaging element of claim 1 wherein said dye has an absorption maximum at a wavelength of about 600 nm to about 1500 nm.

3. The thermal imaging element of claim 1 wherein said dye is selected from the group of cationic dyes and neutral dyes.

4. The thermal imaging element of claim 3 wherein said dye is selected from the group of polymethine dyes, pyrylium dyes, cyanine dyes, diamine dication dyes, phenazinium dyes, phenoxazinium dyes, acridinium dyes, xanthene dyes, and squarylium dyes.

5. The thermal imaging element of claim 4 wherein said dye is selected from the group of:

(I)

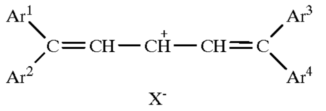

and (II)

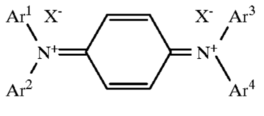

wherein each $Ar^1$ to $Ar^4$ is independently an aryl group and at least two of said aryl groups have a tertiary amino group in the 4 position, and X is an anion.

6. The thermal imaging element of claim 1 wherein $R^5$ is of H or phenyl, $R^6$ is phenyl, and $R^7$ and $R^8$ are each a lower alkyl.

7. A laser addressable thermal imaging element comprising a bleachable photothermal converting dye in association with a heat-sensitive imaging medium, and a photoreducing agent for said dye, said photoreducing agent bleaching said dye on laser address of the element; wherein said photoreducing agent is a neutral reducing agent having one or more labile hydrogen atoms or acyl groups.

8. The thermal imaging element of claim 1 wherein at least one mole of reducing agent is present per mole of dye.

9. A laser addressable thermal imaging element comprising a bleachable photothermal converting dye in association with a heat-sensitive imaging medium, and a photoreducing agent for said dye, said photoreducing agent bleaching said dye on laser address of the element; wherein said dye is a cyanine dye or a squarylium dye, and said photoreducing agent is an acyl protected leuco dye.

10. The thermal imaging element of claim 1 wherein said element is part of a colorant transfer system, a peel-apart system, a phototackification system, or a unimolecular thermal fragmentation system.

11. The thermal imaging element of claim 10 further comprising a fluorocarbon.

12. A method of imaging comprising:

providing a laser addressable thermal imaging element comprising a bleachable photothermal converting dye in association with a heat-sensitive imaging medium, and a photoreducing agent for said dye, said photoreducing agent bleaching said dye on laser address of the element; and exposing said thermal imaging element to laser irradiation at a wavelength absorbed by said photothermal converting dye, under exposure conditions such that absorption by said dye generates sufficient heat for imaging of said heat-sensitive imaging medium, and said reducing agent bleaches said dye; wherein the photoreducing agent is a compound having the formula:

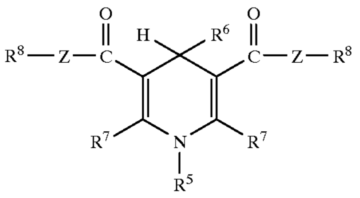

wherein:

$R^5$ is selected from the group of H, alkyl, aryl, alicyclic, and heterocyclic groups;

$R^6$ is an aryl group;

each $R^7$ and $R^8$ is independently selected from the group of alkyl aryl, alicyclic, and heterocyclic groups; and Z is a covalent bond or an oxygen atom.

* * * * *

UNITED STATES PATENT AND TRADEMARK OFFICE
CERTIFICATE OF CORRECTION

PATENT NO.: 5,945,249

DATED: Aug. 31, 1999

INVENTOR(S): Patel et al.

It is certified that errors appear in the above-identified patent and that said Letters Patent is hereby corrected as shown below:

First page, left-hand column, under "Inventors", delete "Mark R. I. Chambers".

Col. 1, line 15, "provide" should be --provides--.

Col. 2, line 6, "(WO93/0441 1)" should be --(WO93/04411)--.

Col. 3, line 56, "invertion" should be --invention--.

Col. 6, line 58, "dialkylimino" should be --dialkylamino--.

Col. 6, line 61, "N-methylanilitio" should be --N-methylanilino--.

Col. 6, line 62, "piperidiino" should be --piperidino--.

Signed and Sealed this

Fifteenth Day of May, 2001

Attest:

NICHOLAS P. GODICI

*Attesting Officer* *Acting Director of the United States Patent and Trademark Office*